(12) United States Patent
Zhang et al.

(10) Patent No.: US 8,450,166 B2
(45) Date of Patent: May 28, 2013

(54) METHOD OF FABRICATING SEMICONDUCTOR DEVICES

(75) Inventors: Yiying Zhang, Beijing (CN); Qiyang He, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/293,030

(22) Filed: Nov. 9, 2011

(65) Prior Publication Data

US 2012/0309151 A1  Dec. 6, 2012

(30) Foreign Application Priority Data

Jun. 2, 2011 (CN) .......................... 2011 1 0147175

(51) Int. Cl.
*H01L 21/306* (2006.01)
*H01L 21/308* (2006.01)
*H01L 29/165* (2006.01)
*H01L 29/66* (2006.01)
*H01L 29/78* (2006.01)

(52) U.S. Cl.
USPC ........... 438/198; 438/285; 438/300; 438/492; 438/701; 438/705; 438/733; 438/734

(58) Field of Classification Search
USPC ................ 438/706, 710, 712, 714, 719, 720, 438/723, 724, 733, 734, 739, 298, 589, 689, 438/707, 303, 285; 257/E21.312, E21.431
See application file for complete search history.

(56) References Cited

U.S. PATENT DOCUMENTS

| 7,303,999 | B1* | 12/2007 | Sriraman et al. | 438/719 |
|---|---|---|---|---|
| 2005/0026367 | A1* | 2/2005 | Streck et al. | 438/259 |
| 2005/0056887 | A1* | 3/2005 | Tran | 257/330 |
| 2005/0148147 | A1* | 7/2005 | Keating et al. | 438/299 |
| 2011/0272739 | A1* | 11/2011 | Lee et al. | 438/285 |
| 2011/0312145 | A1* | 12/2011 | Tsai et al. | 438/300 |
| 2012/0058616 | A1* | 3/2012 | Ahn et al. | 438/285 |

* cited by examiner

*Primary Examiner* — Olik Chaudhuri
*Assistant Examiner* — Wilner Jean Baptiste
(74) *Attorney, Agent, or Firm* — Innovation Counsel LLP

(57) ABSTRACT

Method of fabricating a semiconductor device includes forming a gate having a first material on a substrate and forming a layer of a second material overlaying the gate. Sidewall spacers are formed on opposite sides of the gate. The substrate is dry etched using the layer of second material and the sidewall spacers as a mask forming a recess in the substrate between two adjacent gates. A liner oxide layer is formed on inner walls of the recess. The liner oxide layer is removed by isotropic wet etching. Orientation selective wet etching is performed on the recess to shape the inner wall of the recess so as to cause the inner wall of the recess to be sigma-shaped. By removing the substrate portions having lattice defects due to dry etching through oxidation and wet etching, defect-free epitaxial growth performance is realized.

17 Claims, 5 Drawing Sheets poor seed growth

METHOD OF FABRICATING SEMICONDUCTOR DEVICES

CROSS-REFERENCES TO RELATED APPLICATIONS

This application claims priority to Chinese Patent Application No. 201110147175.1, filed on Jun. 2, 2011 and entitled "Method of Fabricating Semiconductor Devices", which is incorporated herein by reference in its entirety. This application is related to commonly assigned U.S. patent application Ser. No. 13/293,001, filed Nov. 9, 2011, and commonly assigned U.S. patent application Ser. No. 13/293,052, filed Nov. 9, 2011, the contents of all of which are incorporated herein by reference in their entirety.

BACKGROUND

1. Field of the Invention

The present disclosure relates to a method of fabricating semiconductor devices, and particularly to a method of fabricating semiconductor devices including PMOS devices having embedded SiGe (eSiGe).

2. Description of the Related Art

In order to meet the demand of users for low profile electronics, in enhanced Very Large Scale Integration (VLSI) processes, stress engineering has been used to improve the performance of devices. One of the effective ways to increase hole mobility in the channel region of a PMOS device is by embedding SiGe (eSiGe) structures. In sigma-shaped (Σ-shaped) eSiGe structures, a specially shaped recess is formed and refilled with SiGe forming source and drain regions to increase stress in the channel region since the lattice constant of SiGe is larger than that of Si and the distance between source and drain regions is reduced by using the Σ-shaped SiGe.

A prior art method of forming Σ-shaped SiGe in a PMOS device is shown in FIG. 1A to FIG. 1D. After forming on a Si substrate a gate and sidewall spacers on opposite sides of the gate (FIG. 1A), a recess is formed between two adjacent gates in the Si substrate by dry etching, as shown in FIG. 1B. The section of the recess shown in FIG. 1B is a substantial rectangle with a planar bottom, which is defined by four vertices A, B, C and D.

Next, as shown in FIG. 1C, the rectangular recess is wet etched in an orientation selective manner to be expanded into Σ-shape. Commonly, orientation selective wet etching is faster on (100) crystal orientation planes than on (111) crystal orientation planes. In fact, orientation selective wet etching substantially stops on (111) crystal orientation planes. As a result, two vertices C and D formed after the dry etching shown in FIG. 1B remain as etch stop points of (111) crystal orientation planes. Finally, as shown in FIG. 1D, SiGe is epitaxially grown in the resulting Σ-shaped recess, so as to form SiGe source and drain regions.

However, conventional method of forming Σ-shaped SiGe suffer from the problem of difficult SiGe epitaxial growth. Specifically, in the dry etching process performed on the substrate shown in FIG. 1B, defects such as Si lattice mismatch or the like may occur at the edges of the formed rectangular recess, particularly at the vertices C and D shown in FIG. 1B, due to plasma bombardment. As mentioned above, as a result of orientation selective wet etching, the vertices C and D will not etch as they are (111) crystal orientation etch stop points. In the subsequent SiGe epitaxial growth, the seed layer is very sensitive to Si surface conditions, such as cleanness and Si lattice condition. Defects such as Si lattice mismatch may lead to the difficulty in the epitaxial growth of a seed layer. Hence, as shown in FIG. 1E, Si lattice defects at points C and D will make the subsequent defect free epitaxial growth of a SiGe seed layer difficult to achieve.

SUMMARY

The present disclosure relates to a method of fabricating semiconductor devices, and particularly to a method of fabricating semiconductor devices including PMOS devices having embedded SiGe (eSiGe).

According to one embodiment of the present invention, a method of fabricating a semiconductor device includes forming a gate having a first material on a substrate, and forming a layer of a second material overlaying the gate. The method of fabricating a semiconductor device further includes forming sidewall spacers on opposite sides of the gate. The method of fabricating a semiconductor device further includes; i) performing a dry etching process on the substrate using the layer of second material and the sidewall spacers as a mask to form a recess in the substrate adjacent the sidewall spacers, ii) performing an oxidation process on the recess to form a liner oxide layer on inner walls of the recess, removing the liner oxide layer by an isotropic wet etching process, and iii) performing an orientation selective wet etching process on the recess to shape the inner wall of the recess so as to cause the inner wall of the recess to be sigma-shaped.

According to one specific embodiment, the liner oxide layer is formed so as to have a thickness which is sufficient to cover substrate portions damaged during the dry etching process of the substrate. According to another specific embodiment, the oxidation process on the recess includes a thermal oxidation or a plasma oxidation process. According to another specific embodiment, the thermal oxidation process includes oxidation on the substrate at a temperature from 700° C. to 1200° C. According to another specific embodiment, the thermal oxidation process includes dry oxidation on the substrate at a temperature from 700° C. to 1200° C. According to another specific embodiment, the plasma oxidation process includes oxidation on the substrate in a radio frequency plasma environment.

According to another specific embodiment, thickness of the liner oxide layer ranges from about 50Å to about 150Å. According to another specific embodiment, the step of removing the liner oxide layer by an isotropic wet etching process includes removing the liner oxide layer using HF solution.

According to another specific embodiment, the step of performing an orientation selective wet etching on the recess includes using tetramethylammonium hydroxide (TMAH). According to another specific embodiment, the etching rate of the orientation selective wet etching on a (100) crystal orientation plane is faster than that on a (111) crystal orientation plane. According to another specific embodiment, the orientation selective wet etching substantially stops on a (111) crystal orientation plane. According to another specific embodiment, the first material is polysilicon.

According to another specific embodiment, the method of fabricating a semiconductor device further includes, performing epitaxial growth of SiGe in the sigma-shaped recess after the orientation selective wet etching process. According to another specific embodiment, the method of fabricating a semiconductor device further includes, performing an ion implantation process on the substrate to form a source region and a drain region before the substrate is dry etched. According to another specific embodiment, the method of fabricating a semiconductor device further includes, performing ion implantation on the substrate to form a source region and a drain region after the epitaxial growth of SiGe is performed in the sigma-shaped recess.

According to another specific embodiment, the depth of the recess is about 300Å to 500Å before the orientation selective wet etching process is performed on the recess. According to another specific embodiment, the method of fabricating a semiconductor device further includes, before performing the dry etching process on the substrate, forming a mask overlaying an area to be formed as a NMOS device and exposing an area to be formed as a PMOS device.

A better understanding of the nature and advantages of the embodiments of the present invention may be gained with reference to the following detailed description and the accompanying drawings.

BRIEF DESCRIPTION OF THE DRAWINGS

FIGS. 1A to 1D show a prior art method of forming Σ-shaped SiGe in a PMOS device, wherein FIG. 1A shows forming gate on a substrate, and sidewall spacers on opposite sides of gate; FIG. 1B shows performing dry etching to form a recess having a substantially rectangular section in the substrate between two adjacent gates; FIG. 1C shows performing orientation selective wet etching on the rectangular recess to expand it into Σ shape; and FIG. 1D shows epitaxially growing SiGe in the Σ-shaped recess to form SiGe source and drain regions.

FIG. 3A shows forming a gate on a substrate, in accordance with an embodiment of the present invention.

FIG. 3B shows performing a dry etch process to form a substantially rectangular recess in the substrate, in accordance with an embodiment of the present invention.

FIG. 3C shows performing oxidation on the recess to form a liner oxide layer on inner walls of the recess, in accordance with an embodiment of the present invention.

FIG. 3D shows removing the liner oxide layer by an isotropic wet etching process, in accordance with an embodiment of the present invention.

FIG. 3E shows performing an orientation selective wet etching process on the substantially rectangular recess to expand the recess into Σ shape, in accordance with an embodiment of the present invention.

DETAILED DESCRIPTION

According to embodiments of the present invention, a method for fabricating semiconductor devices including PMOS devices having embedded SiGe (eSiGe) is provided. In an embodiment of this disclosure, good, defect free epitaxial growth performance is achieved by forming an oxide layer for substrate portions that are damaged during dry etching, with an oxidation process after the dry etching, and then removing the oxide layer to remove the substrate portions having lattice defects before the epitaxial growth of SiGe.

Figure 1A:
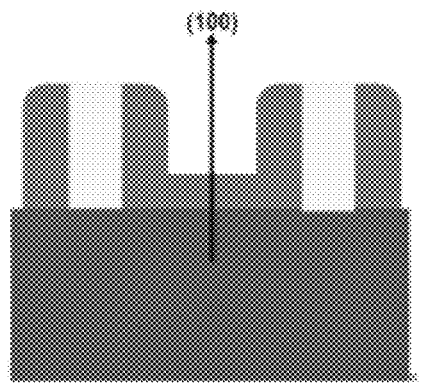
Figure 1B:
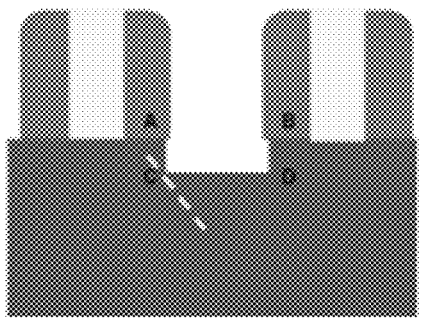
Figure 1C:
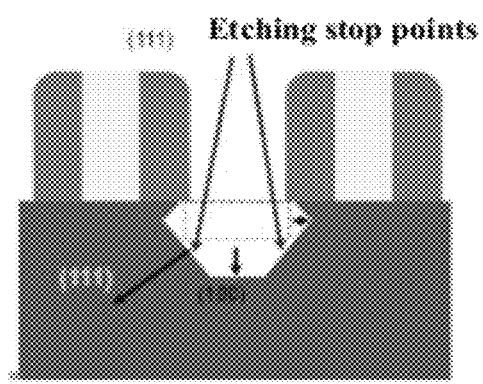
Figure 1D:
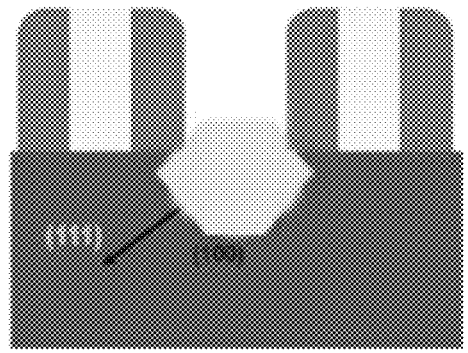
Figure 1E:
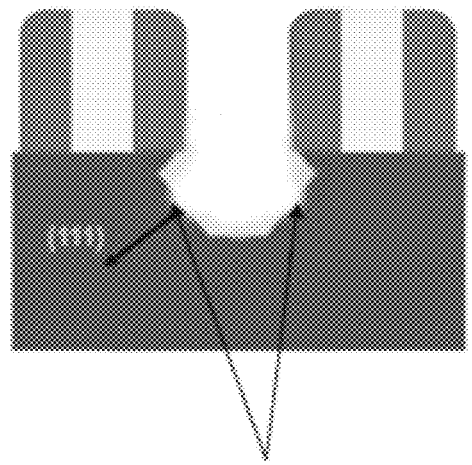
FIG. 1E shows the defects of the prior art method illustrated in FIG. 1A to FIG. 1D.
Figure 2:
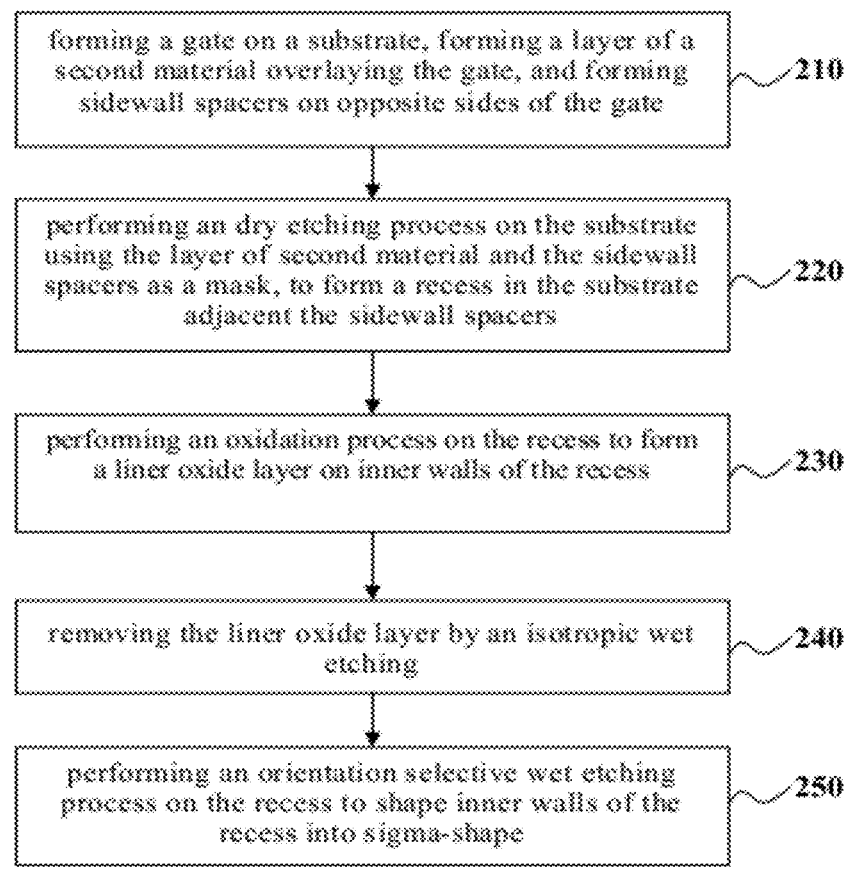
FIG. 2 schematically shows a flowchart of a method of forming Σ-shaped recess in a PMOS device, in accordance with an embodiment of the present invention.

FIG. 2 schematically shows a flowchart of a method of forming a Σ-shaped recess in a PMOS device, in accordance with an embodiment of the present invention. FIG. 3A to FIG. 3E show simplified cross-section views of various steps of the method of forming the Σ-shaped recess in FIG. 2, in accordance with embodiments of the present invention.

Figure 3A:
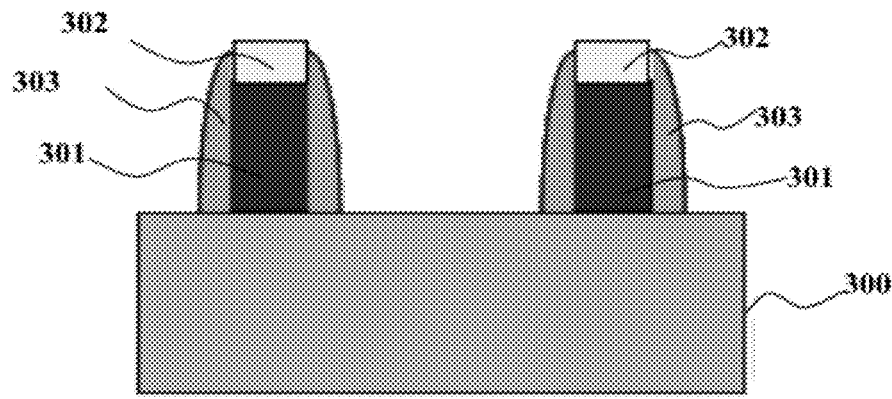
FIG. 3A to FIG. 3E show simplified cross-section views of various steps of the method of forming the Σ-shaped recess in FIG. 2, in accordance with embodiments of the present invention.

First, at step 210 in FIG. 2, a substrate is provided, on which gates are formed on the substrate. FIG. 3A shows forming a gate 301 having a first material on a substrate 300 and forming a layer of a second material 302 overlaying gate 301, in accordance with an embodiment of the present invention. The gate may include a dielectric layer overlying the substrate and a gate overlying the dielectric layer. The dielectric layer may be a silicon dioxide layer. Sidewall spacers 303 are formed on opposite sides of gate 301. The substrate may be made of Si. Here, the first material of the gates may be, for example, polysilicon. Layer of second material 302 and the sidewall spacers 303 are used to protect gate 301 in subsequent dry etching, wet etching, oxidation and source/drain ion-implantation processes. The second material may be, for example, silicon nitride. Sidewall spacers 303 may be, for example, silicon nitride or silicon oxide. Gate 301, layer of second material 302, and sidewall spacers 303 may be formed by use of any processes well known by those skilled in the art, descriptions of which are omitted for the purpose of simplicity.

Figure 3B:
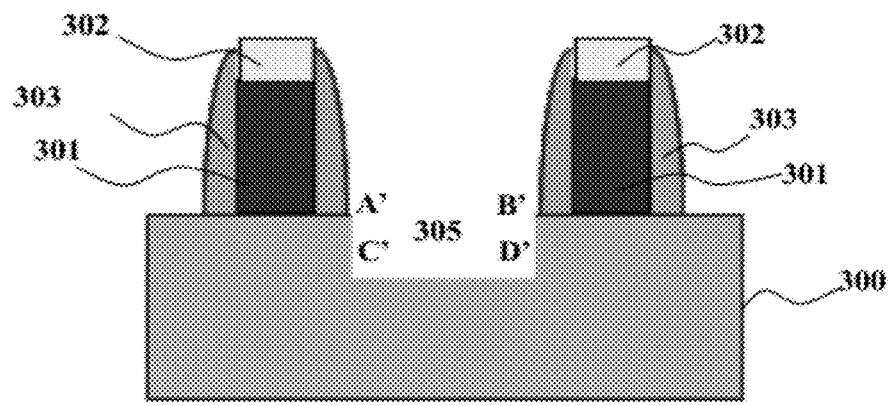

Next, at step 220 in FIG. 2, and FIG. 3B show performing a dry etch process to form a substantially rectangular recess 305 in the substrate, in accordance with an embodiment of the present invention. Substrate 300 is dry etched using the layer of second material and the sidewall spacers as a mask to form a substantial rectangular recess 305 defined by four vertices A', B', C' and D', in the substrate adjacent the sidewall spacers between two adjacent gates. Here, HBr or $C_{12}$ may be used as main reactive gases in the dry etching.

Figure 3C:
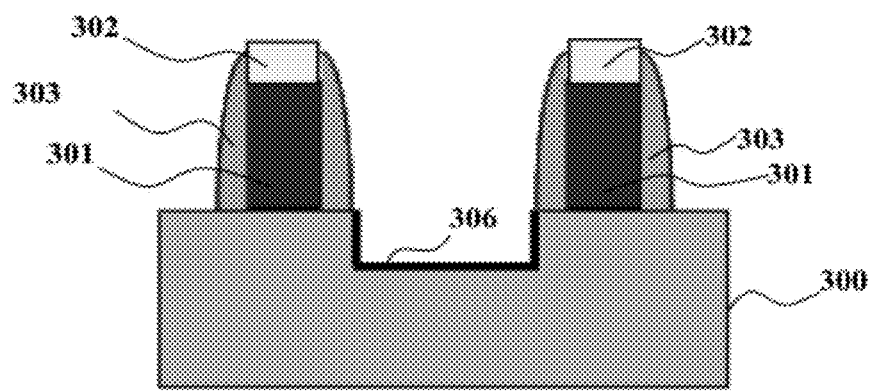

Next, at step 230 in FIG. 2 and FIG. 3C show performing oxidation on the recess to form a liner oxide layer 306 on inner walls of recess 305, in accordance with an embodiment of the present invention. In the case of a Si substrate, liner oxide layer 306 formed through oxidation is silicon dioxide, for example, $SiO_2$.

In some embodiments, liner oxide layer 306 may be formed by a thermal oxidation process including wet oxidation and dry oxidation. In one example, recess 305 is thermally oxidized at a temperature of 700° C. to 1200° C. If a thinner liner oxide layer 306 is desirable, a dry oxidation process is preferable.

In other embodiments, liner oxide layer 306 may be formed by a plasma oxidation process. For example, recess 305 may be supplied with oxygen in a radio frequency plasma environment. In one example, liner oxide layer 306 may be formed under process conditions including a pressure of 10 mT to 1000 mT, a flow rate of oxygen of 10 to 5000 sccm, and a temperature of 140° C. to 600° C.

In the oxidation process of step 230, the formation of the liner oxide layer 306 may be controlled by adjusting the flow rate of oxygen and the reaction temperature, so that the thickness of liner oxide layer 306 is sufficient to repair those substrate portions damaged during the dry etching of substrate 300. In one example, the thickness of the liner oxide layer 306 ranges from about 50Å to about 150Å.

Figure 3D:
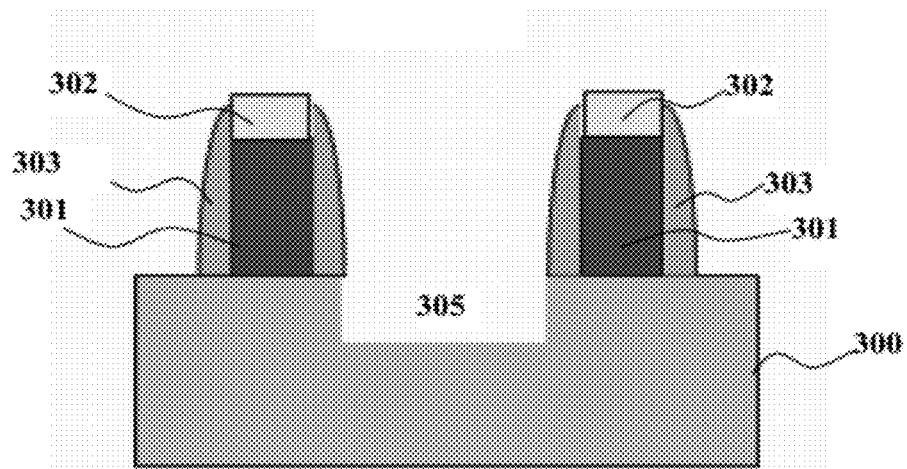

Next, at step 240 in FIG. 2 and FIG. 3D show removing the liner oxide layer 306 by an isotropic wet etching process, in accordance with an embodiment of the present invention. In one embodiment, in the case that liner oxide layer 306 is $SiO_2$, liner oxide layer 306 may be removed by using an HF solution. For example, the wet etching process mentioned above may be performed using a solution of $H_2O$ and HF in a mass proportion of 100:1 or 50:1 at a temperature of 23±0.5° C. In one example, after liner oxide layer 306 is removed, the depth H of the recess 305 may be, for example, about 300Å to about 500Å.

As mentioned above, the edges of recess 305 and especially vertices C' and D', are often damaged due to plasma bombardment during the dry etching process at step 220, so that defects, such as lattice mismatch, may occur at the edges for example. In this embodiment, potentially damaged edges of recess 305, including vertices C' and D', may be removed by forming liner oxide layer 306 on the potentially damaged substrate portions by the oxidation process of step 230, and then removing the obtained oxide layer by the isotropic wet etching process at step 240 to expose surfaces with fewer or no defects, so as to overcome the problem in conventional processes where defected portions in the substrate may make the defect free epitaxial growth of a SiGe seed layer difficult to achieve.

Figure 3E:
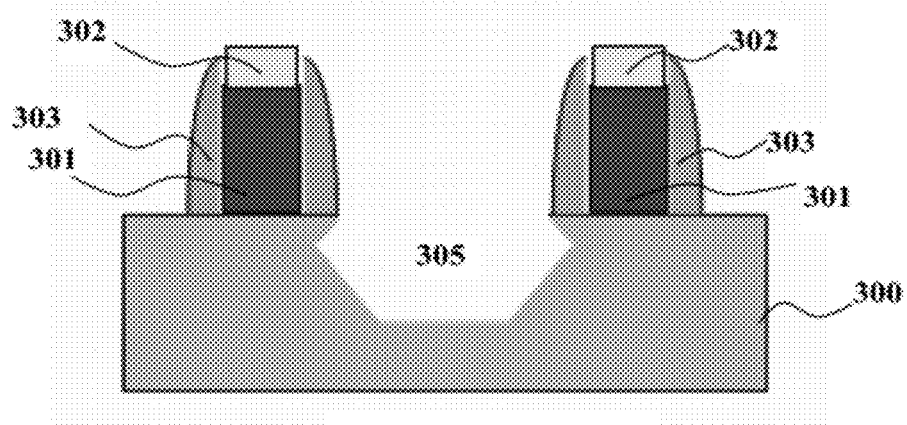

Finally, at step 250 in FIG. 2 and FIG. 3E show performing an orientation selective wet etching process on the substantially rectangular recess to expand the recess into Σ shape, in accordance with an embodiment of the present invention. Orientation selective wet etching is performed on recess 305 to shape the inner walls of recess 305 into sigma-shape (E form). In one embodiment, an orientation selective wet etching process that is faster on (100) crystal orientation planes than on (111) crystal orientation planes may be used. For example, tetramethylammonium hydroxide (TMAH) with mass concentration of 10% to 25% may be used for etching at a temperature of 70° C. to 90° C. In such case, the etching substantially stops on (111) crystal orientation planes.

It should be noted that, before performing dry etching on the substrate, i.e. before step 220 in FIG. 2, or after the orientation selective wet etching process on the recess, i.e. after step 250 in FIG. 2, ion implantation may be performed on the substrate to form a source region and a drain region.

By removing the substrate portions having lattice defects due to dry etching through oxidation and wet etching processes, good defect free epitaxial growth performance may be achieved.

It should be noted that, eSiGe structures functioning as source/drain regions generally work in PMOS transistors. Thereby, with respect to semiconductor devices having both PMOS and NMOS transistors, it is necessary to shield the portions with NMOS transistors with a mask, or the like, during the formation of the PMOS transistors into Σ shape.

Embodiments of the present invention provide an apparatus and a method for fabricating MOS devices. It will be apparent to those with skill in the art that modifications to the above methods and apparatuses may occur without deviating from the scope of the present invention. The embodiments of the present invention are not limited by the type of transistor, PMOS, NMOS or otherwise, used to fabricating MOS devices. The embodiments of the present invention are not limited by the type of integrated circuit in which the present invention may be disposed. Nor are the embodiments of the present invention limited to any specific type of process technology, e.g., CMOS, Bipolar, or BICMOS that may be used to manufacture MOS devices. Accordingly, the disclosures and descriptions herein are intended to be illustrative, but not limiting, of the scope of the invention, which is set forth in the following claims along with their full scope of equivalents.

What is claimed is:

1. A method of fabricating a semiconductor device comprising:
    forming a gate having a first material on a substrate;
    forming a layer of a second material overlaying the gate;
    forming sidewall spacers on opposite sides of the gate;
    performing a dry etching process on the substrate using the layer of second material and the sidewall spacers as a mask to form a recess in the substrate adjacent the sidewall spacers;
    performing an oxidation process on the recess to form a liner oxide layer on inner walls of the recess;
    removing the liner oxide layer by an isotropic wet etching process; and
    performing an orientation selective wet etching process on the recess to shape the inner wall of the recess so as to cause the inner wall of the recess to be sigma-shaped.

2. The method according to claim 1, wherein the liner oxide layer is formed so as to have a thickness which is sufficient to cover substrate portions damaged during the dry etching process of the substrate.

3. The method according to claim 1, wherein the oxidation process on the recess includes a thermal oxidation or a plasma oxidation process.

4. The method according to claim 3, wherein the thermal oxidation process includes oxidation on the substrate at a temperature from 700° C. to 1200° C.

5. The method according to claim 3, wherein the thermal oxidation process includes dry oxidation on the substrate at a temperature from 700° C. to 1200° C.

6. The method according to claim 3 wherein the plasma oxidation process includes oxidation on the substrate in a radio frequency plasma environment.

7. The method according to claim 1, wherein thickness of the liner oxide layer ranges from about 50Å to about 150Å.

8. The method according to claim 1, wherein the step of removing the liner oxide layer by an isotropic wet etching process includes using HF solution.

9. The method according to claim 1, wherein the step of performing an orientation selective wet etching on the recess includes using tetramethylammonium hydroxide (TMAH).

10. The method according to claim 1, wherein the etching rate of the orientation selective wet etching on a (100) crystal orientation plane is faster than that on a (111) crystal orientation plane.

11. The method according to claim 1, wherein the orientation selective wet etching substantially stops on a (111) crystal orientation plane.

12. The method according to claim 1 wherein the first material is polysilicon.

13. The method according to claim 1, further comprising:
    performing epitaxial growth of SiGe in the sigma-shaped recess after the orientation selective wet etching process.

14. The method according to claim 13, further comprising:
    performing ion implantation on the substrate to form a source region and a drain region after the epitaxial growth of SiGe is performed in the sigma-shaped recess.

15. The method according to claim 1, further comprising:
    performing an ion implantation process on the substrate to form a source region and a drain region before the substrate is dry etched.

16. The method according to claim 1, wherein the depth of the recess is about 300Å to 500Å before the orientation selective wet etching process is performed on the recess.

17. The method according to claim 1, further comprising:
    before performing the dry etching process on the substrate, forming a mask overlaying an area to be formed as a NMOS device and exposing an area to be formed as a PMOS device.

* * * * *